United States Patent
Prabhat et al.

(10) Patent No.: US 9,542,994 B1
(45) Date of Patent: Jan. 10, 2017

(54) RETENTION CONTROL IN A MEMORY DEVICE

(71) Applicant: ARM Limited, Cambridge (GB)

(72) Inventors: Pranay Prabhat, Cambridge (GB); James Edward Myers, Cambridge (GB)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 14/855,068

(22) Filed: Sep. 15, 2015

(51) Int. Cl.
*G11C 11/40* (2006.01)
*G11C 11/417* (2006.01)
*G11C 11/4072* (2006.01)
*G11C 11/413* (2006.01)

(52) U.S. Cl.
CPC .......... *G11C 11/417* (2013.01); *G11C 11/4072* (2013.01); *G11C 11/413* (2013.01)

(58) Field of Classification Search
CPC .. G11C 11/40; G11C 11/4063; G11C 11/4072; G11C 11/413; G11C 11/417
USPC ............... 365/154, 189.11, 230.06, 226, 228
See application file for complete search history.

(56) References Cited

U.S. PATENT DOCUMENTS

| | | | | |
|---|---|---|---|---|
| 7,313,033 B2 * | 12/2007 | Fuhrmann | ............... | G11C 5/147 365/189.09 |
| 9,001,570 B1 * | 4/2015 | Sachan | ................. | G11C 11/418 365/154 |

* cited by examiner

*Primary Examiner* — Tan T. Nguyen
(74) *Attorney, Agent, or Firm* — Pramudji Law Group PLLC; Ari Pramudji

(57) ABSTRACT

A memory device and method of operating the memory device are provided. The memory device has bitcells arranged in a plurality of rows and columns. Row driver circuitry provides access to the array of bitcells by selection of an access row of the plurality of rows. The row driver circuitry comprises a retention control latch to store a retention control value and row power gating circuitry responsive to a retention signal to power gate at least one row when the retention control value has a first value and to leave the at least one row powered when the retention control value has a second value. Row-based retention of the content of the bit cells is thus provided, and the leakage current of the memory device when it is in a retention (e.g. sleep) mode, and only some of its rows contain valid data, can thus be reduced.

19 Claims, 9 Drawing Sheets

RETENTION CONTROL IN A MEMORY DEVICE

TECHNICAL FIELD

The present disclosure relates to memory devices. More particularly it relates to control over the retention of values stored in a memory device.

BACKGROUND

Values stored in the bitcells of a memory device may be retained when the memory device goes into a retention mode, in which the device shuts down into a low power mode to reduce its power consumption whilst it is not in active use and then later returns to an active data processing mode in which the data values retained during the retention mode can once again be accessed and processed. This may for example be supported by providing the memory device with a power gating switch enabling the bitcells of the memory device to be coupled to and decoupled from a power rail. For example an SRAM memory device may be put into a retention mode in which, whilst not operationally accessible, the memory content is nevertheless retained by all bitcells of the RAM by means of such coupling being enabled.

SUMMARY

At least one embodiment provides a memory device comprising an array of bitcells arranged in a plurality of rows and a plurality of columns; and row driver circuitry to provide access to the array of bitcells by selection of an access row of the plurality of rows, wherein the row driver circuitry comprises a retention control latch to store a retention control value and row power gating circuitry responsive to a retention signal to power gate at least one row when the retention control value has a first value and to leave the at least one row powered when the retention control value has a second value.

At least one embodiment provides a method of operating a memory device comprising storing data in an array of bitcells arranged in a plurality of rows and a plurality of columns; providing access to an access row of the array of bitcells by selection of the access row of the plurality of rows; storing a retention control value for a row of the plurality of rows; and in response to a retention signal, power gating at least one row when the retention control value has a first value and leaving the at least one row powered when the retention control value has a second value.

At least one embodiment provides a memory device comprising means for storing data in an array of bitcells arranged in a plurality of rows and a plurality of columns; means for providing access to an access row of the array of bitcells by selection of the access row of the plurality of rows; means for storing a retention control value for a row of the plurality of rows; and means for power gating at least one row in response to a retention signal when the retention control value has a first value, means for leaving the at least one row powered in response to the retention signal, when the retention control value has a second value.

BRIEF DESCRIPTION OF THE DRAWINGS

The present techniques will be described further, by way of example only, with reference to embodiments thereof as illustrated in the accompanying drawings, in which.

DESCRIPTION OF EXAMPLE EMBODIMENTS

Figure 1:
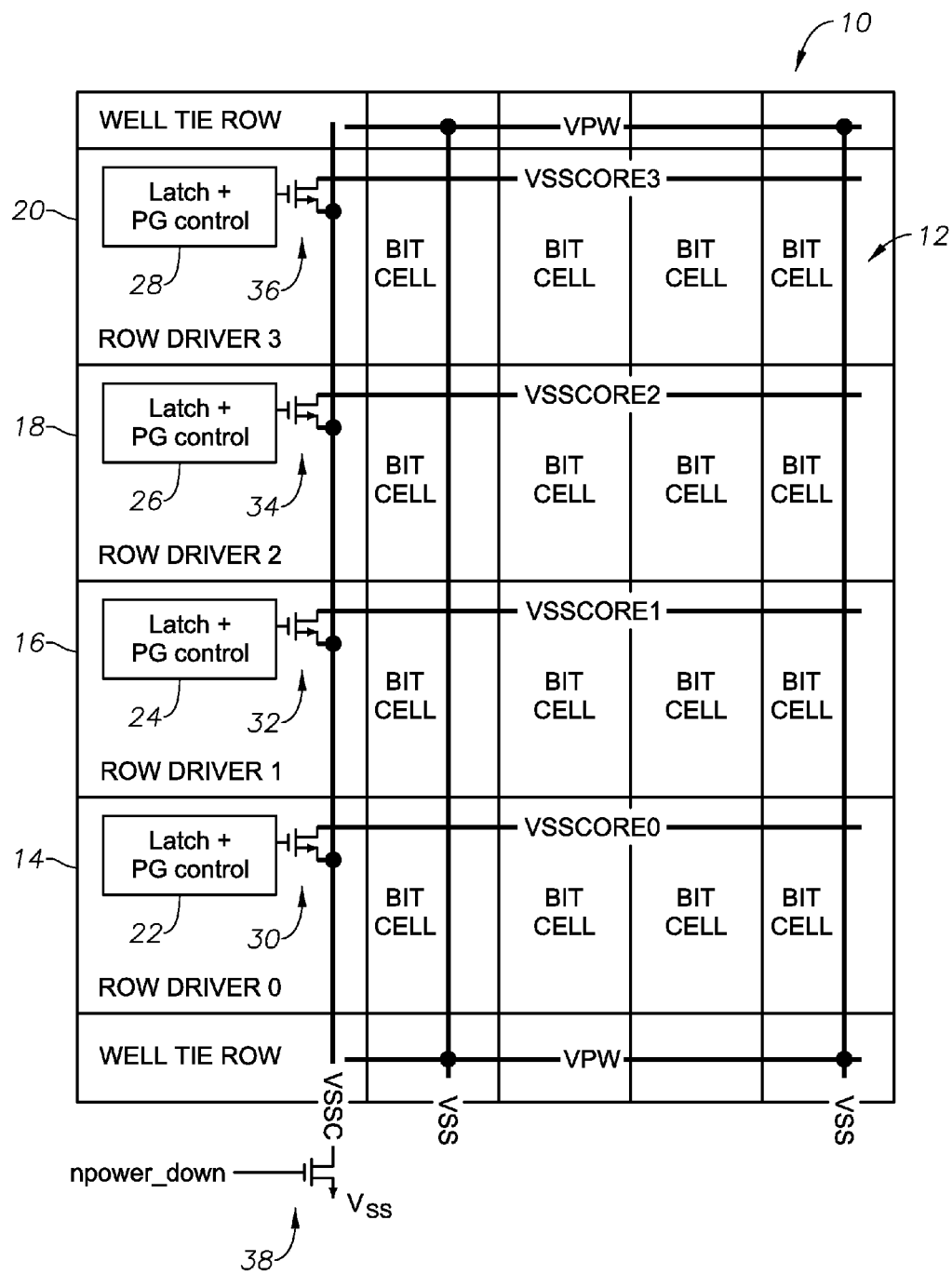
FIG. 1 schematically illustrates a memory device in one embodiment.

At least one embodiment provides a memory device comprising an array of bitcells arranged in a plurality of rows and a plurality of columns; and row driver circuitry to provide access to the array of bitcells by selection of an access row of the plurality of rows, wherein the row driver circuitry comprises a retention control latch to store a retention control value and row power gating circuitry responsive to a retention signal to power gate at least one row when the retention control value has a first value and to leave the at least one row powered when the retention control value has a second value.

The array of bit cells in the memory device are arranged in the regular fashion of multiple rows and columns. Moreover, row driver circuitry is provided which allows access to the array of bit cells by selection of a given row to which access is required, wherein that row to be accessed is selected whilst other rows in the array of bit cells are left inactive (with regard to access). The present techniques propose that the row driver circuitry comprises a retention control latch which stores a retention control value and is used when the memory device enters a retention mode, i.e. typically when the memory device is put into a sleep mode because it is known that the memory device will not be required to be accessible for a sufficiently long period that this is determined to be worthwhile. The present techniques further propose that the row driver circuitry is responsive to a retention signal (indicating that the memory device should enter its retention mode) to power gate at least one row of the memory device in dependence on the retention control value held by the retention control latch. Specifically, if the retention control value has a first value then the row power gating circuitry causes at least one row of the memory device to be power gated (and as a result any data stored in the bit cells of that at least one row will be lost), and if the retention control value has a second value then the row power gating circuitry leaves the at least one row of bit cells powered (i.e. the data stored in the at least one row is retained when the memory device is in its retention mode). Row driver circuitry will typically be provided for each row of the plurality of rows in the memory device, and a retention control latch may be provided for each row, but this is not required and one retention control latch may determine the operation of row power gating circuitry for more than one row. Similarly, row power gating circuitry may be provided in each row driver circuitry, but this is also not essential and there may be fewer instances of the row power gating circuitry than of the row driver circuitry and/or of the number of rows in the memory device, and in this situation one instance of row power gating circuitry may determine (via selective power gating based on a retention control value) the retention of more than one row.

Accordingly, in response to the retention signal (e.g. as part of the memory device entering a sleep mode) the present techniques provide the memory device with the ability to selectively retain some rows of bit cells in the memory device, whilst causing others to be power gated (and hence lose their content). Thus, a useful balance may be struck between the benefits of power gating rows of bit cells in the memory device, in order to reduce the leakage current of the memory device in a sleep mode, and on the other hand being able to retain the content of some rows of bit cells in the memory device. One example situation in which the present techniques are applicable is in the context of a device which spends a significant proportion of time in a sleep retention mode with only short intermittent periods of activity. For example, a wireless sensor node may spend the majority of its lifetime in a deep sleep retention mode, only waking up periodically to sample a sensor. After a given number of sensor samples have been recorded, the samples may be processed and transmitted (for example to a central control device which is in wireless communication with a number of such sensor nodes). The large proportion of time which the device spends in its sleep retention mode means that the power consumption of the device whilst in that retention mode is a key metric when seeking to improve the battery life of the device, and it has been found that, for example in a device with an SRAM memory, the SRAM leakage current dominates over the logic leakage current.

The present techniques recognise that when a memory device forms part of a data processing apparatus which operates in this manner, in particular for example where an accumulated data frame is transmitted and then gradually refilled as the periodic samples from the sensor are taken, that the average occupancy of the memory space allocated for this data frame will only be half of the space allocated (since it is filled linearly). Overall therefore if the unused locations in the memory device are able to be individually power gated, then approximately half the leakage energy expended by the memory device in its retention (sleep) mode can be reclaimed. The larger the data frame and the longer the period over which it is filled will consequently result in greater benefit being derived from this technique. Thus the present techniques provide circuitry which enables such "fine-grained" retention to be carried out (on a row-by-row basis within the array of bit cells of the memory device), such that the leakage energy expended is proportional to the actual data stored, rather than the full memory size. The present techniques are not only applicable to such linearly filling memory devices and any memory device which isn't making 100% use of the storage capacity of a retentive device (whether this is to store data, to store instructions, for stack allocation, etc.) can benefit. As such, the present techniques address the problem of finding a balance between using a large memory instance to save area versus many small instances for leakage power.

In some embodiments the row driver circuitry comprises row access capturing circuitry to set the retention control value to the second value when at least one of the at least one rows is accessed. This therefore means that when an access is made to a row within the memory device the row access capturing circuitry causes the corresponding retention control value to be set to the second value, meaning that subsequent assertion of the retention signal will result in that row remaining powered and hence retain its content. In other words, after a suitable reset of all retention control values, rows which are accessed (for example for data to be written into those rows) will be retained when going into retention, whilst rows which have not been accessed will be power gated and the leakage current associated with these rows can therefore be reduced.

In some embodiments the row driver circuitry comprises address decoding circuitry responsive to a memory address which specifies the access row to generate a row enable signal, and the row access capturing circuitry is responsive to generation of the row enable signal to set the retention control value to the second value. Thus the row access capturing circuitry may make use of the row enable signal generated by the address decoding circuitry in order to determine when to set the retention control value to the second value.

In some embodiments the row driver circuitry comprises row selection input circuitry to receive a row selection signal and the row driver circuitry is responsive to assertion of the row selection signal to set the retention control value to the second value. Thus a dedicated row selection signal may be used, allowing a particular row of the memory device to be indicated from external to the memory device and this row selection signal is received by the row selection input circuitry, which in response sets the retention control value to the second value meaning that this row will then be retained in retention. Thus, even without, say, access being made to that particular row, a particular row may be defined to be retained by this mechanism.

The manner in which this row selection signal is provided may take a variety of forms, but in some embodiments the memory device further comprises a retention address bus to carry a retention address and wherein the row driver circuitry comprises retention address decoding circuitry to generate the row selection signal in dependence on the retention address. In other words, a dedicated retention address bus may be provided in order to enable the source of this instruction to set the retention control value to the second value for a particular row to do so in terms of a memory address specifying that row. The correspondence between a regular memory address for the purposes of a normal memory access and a retention address can be useful to the user of this memory device.

Some embodiments may allow the retention control value to be changed at any time, i.e. in any given clock cycle. However in some embodiments the row driver circuitry comprises latch update control circuitry responsive to a received update control signal to allow the retention control value to be changed when the update control signal has a first value and to prevent the retention control value from being changed when the update control signal has a second value. This latch update control circuitry therefore ensures that the retention control value can only be changed (updated) when the received update control signal which it receives has the first value. For example therefore the memory device may be configured such that the update control signal is only asserted in certain clock cycles (i.e. typically not during regular read or write access clock cycles) and this may for example be used in order to allow the above-mentioned row selection signal and/or retention address to be responded to (latched) when the update control signal has its first value in a dedicated (non read or write) clock cycle.

The rows of the array may have a configuration such that the row power gating circuitry of each row operates entirely independently of the row power gating circuitry of other rows, but in some embodiments the row driver circuitry comprises retention value override circuitry to modify the retention control value to be received by the row power gating circuitry in dependence on an override signal, wherein the retention value override circuitry of a first row of the array is coupled to the retention value override circuitry of a second row of the array, wherein an output of the retention value override circuitry of the first row provides the override signal for the retention value override circuitry of the second row. Thus, the row driver circuitry of at least two rows of the array (but possibly more, and indeed possibly all) may be coupled together in this manner, such that the override signal can be asserted in order to modify the retention control value received by the power gating circuitry (i.e. in dependence on the override signal) and the row power gating circuitry may receive the retention control value held in the retention control latch unmodified or may receive a modified (i.e. inverted, typically) retention control value. Further, the arrangement wherein the override signal for the retention value override circuitry of the second row is provided by an output of the retention value override circuitry of the first row means that an arrangement can be set up in which the retention control value of the first row of the array (and noting that in this context the "first" and "second" rows of the array do not necessarily relate to any numerical ordering or position of the rows concerned) can also effectively define the retention control value received by the row power gating circuitry of the second row. One particular manner in which this arrangement may be used is in order to provide a memory device which "remembers" the largest accessed row address and any row lower than this in the memory space will also be retained, along with that largest access row address, when the device goes into retention. All other (higher) rows will be power gated when the memory device goes into retention. In other words, the retention value override circuitries, override signals, and the connection between the respective retention value override circuitries mean that the specification (possibly by access) of the second value of the retention control value for a given (highest) row is translated into a thermometric code having that given row as the highest row represented by the thermometric code and all lower rows.

As mentioned above, the retention value override circuitries may be provided for only a selection of the rows, but in some embodiments the majority (and possibly all), of the plurality of rows are provided with row driver circuitry which comprises retention value override circuitry and the retention value override circuitries of a plurality of rows are concatenated into a serial sequence.

In some embodiments the row driver circuitry comprises a slave latch coupled to the retention control latch, and the slave latch of a first row is coupled to the retention control latch of a second row of the array to form a synchronous scan path. Thus, at least two rows of the memory device may have slave latches wherein the slave latch of one row is coupled to the retention control latch of the second row, forming a synchronous scan path, wherein the content of the slave latch of the first row can be clocked into the retention control latch of the second row.

The synchronous scan path may only comprise a subset of the plurality of rows but in some embodiments the slave latches and retention control latches of the plurality of rows are concatenated into a synchronous scan path. Thus, a full set of retention control values held by the retention control latches of all rows of the memory device may be accessed via this synchronous scan path.

This access via the synchronous scan path may be used to read out the retention control values and accordingly in some embodiments the memory device is responsive to a scan-out control signal to scan out a set of retention control values held in the slave latches of the row driver circuitry of the plurality of rows. Alternatively or in addition the synchronous scan path may be used to impose a set of retention control values held by the plurality of rows and accordingly in some embodiments the memory device is responsive to a scan-in control signal to scan in a set of retention control values into the slave latches of the row driver circuitry of the plurality of rows. Such functionality may be used for test and debug purposes as it effectively bypasses the usual mechanisms by which the retention control values are set and controls and/or reads the retention latch pattern directly. It may also be used so that software can mark specific memory sections as either expendable or "worth retaining", e.g. to retain program code that is to be reused, but not temporary data.

The bitcells of the memory device may be sub-divided into a number of banks of bitcells and in some embodiments the array of bitcells comprises a plurality of banks of bitcells, the row driver circuitry comprises access clock input circuitry to receive an access clock signal, and the row driver circuitry is dependent on assertion of the access clock signal and a bank selection signal to allow selection of that row of the plurality of rows. The bank selection signal can therefore be combined with the access clock signal in order to give finer retention granularity with a regard to the array of bitcells.

The retention control latch may be provided in a variety of forms, but in some embodiments the retention control latch comprises non-volatile storage to store the retention control value. Accordingly, even when the memory device has entered a low power mode, once it exits that low power mode the value stored in retention control latch or values stored in the latches of the memory device will remain, and can be made further use of if it is desired to continue the evolution of the retention latch pattern after the memory device has exited its sleep mode.

Power gating circuitry may be provided in association with the rows of the memory device in a variety of ways. For example in some embodiments the at least one row comprises power gating circuitry to power gate the at least one row in dependence the retention control value stored in the retention control latch. Thus, there may for example be a one-to-one relationship between the instances of power gating circuitry in the memory device and the rows.

However, in some embodiments at least one shared power gate row comprises power gating circuitry to power gate the at least one shared power gate row and at least one further shared power gate row in dependence on the retention control value stored in the retention control latch or latches of the at least one shared power gate row. In such embodiments a single instance of power gating circuitry will then power gate more than one row. The finer the granularity of the row power gating the greater the opportunity for the reduction of leakage current in the retention mode, but more instances of power gating circuitry will also occupy more area of the memory device. This trade-off is a balance that can be struck by the system designer in dependence on the particular device performance and size requirements. Whether or not this power gating occurs can depend on a retention control value of just one retention control latch of a corresponding one of the rows which this power gating circuitry controls, or may depend on retention control values stored in several latches (for example of any of the rows controlled by this power gating circuitry), such that if any of these shared power gate rows are accessed (or directly marked for retention) then all of this set of shared power gate rows will be retained in the retention mode.

In some embodiments the memory device comprises footer power gate circuitry to power gate the plurality of rows in dependence on the retention signal, wherein the footer power gate circuitry exhibits a lower current leakage than the power gate circuitry of any of the plurality of rows. It may be desirable due to the addition of power gating circuitry to several (if not all) of the rows of the memory device to keep their size relatively small in order to keep the overall size of the row driver circuitry of the memory device below a certain threshold and therefore these row-based power gating circuitry instances may not be able to be provided as very low leakage devices (for example with thick gate oxide, and very long length). Nevertheless the present techniques address this by, in some embodiments, providing footer power gate circuitry which it itself exhibits a lower current leakage than the power gate circuitry of any of the plurality of rows. This footer power gate circuitry, since there may be only one instance thereof, and moreover since it does not have to match the dense bitcell array layout (unlike components in the row line drivers which have to match the bitcell dimensions), can be provided as a physically larger low leakage device (for example with thick gate oxide and/or long length), so that a low power-down mode leakage can nevertheless be provided without the overall size of the memory device being significantly affected.

At least some embodiments provide a method of storing data in an array of bitcells arranged in a plurality of rows and a plurality of columns; providing access to an access row of the array of bitcells by selection of the access row of the plurality of rows; storing a retention control value for a row of the plurality of rows; and in response to a retention signal, power gating at least one row when the retention control value has a first value and leaving the at least one row powered when the retention control value has a second value.

At least some embodiments provide a memory device comprising means for storing data in an array of bitcells arranged in a plurality of rows and a plurality of columns; means for providing access to an access row of the array of bitcells by selection of the access row of the plurality of rows; means for storing a retention control value for a row of the plurality of rows; and means for power gating at least one row in response to a retention signal when the retention control value has a first value, means for leaving the at least one row powered in response to the retention signal, when the retention control value has a second value.

Some particular embodiments will now be described with reference to the figures. FIG. 1 schematically illustrates a memory device 10 in one embodiment. The memory device 10 is shown in FIG. 1 as comprising an array of sixteen bitcells 12 arranged into four rows and four columns, but it will be recognised by one of ordinary skill in the art that a memory device comprising an array of bit cells will typically comprise many more bit cells arranged into many more rows and columns, but a simplified example is used in illustration of FIG. 1 purely for visual clarity. It should be noted that the array of bit cells 12 does not comprise a set of vertical VSSC power rails in the common manner. Accordingly, each row's VSSCORE rail is separated into a distinct net. Nevertheless, the substrate is still tied to always-on VSS in the usual manner. Each row in the memory device is provided with a row driver 14, 16, 18, 20 respectively. Each row driver (circuitry) comprises latch and power gate control circuitry 22, 24, 26, 28 respectively, which will be described in more detail with reference to the figures which follow. In essence however, the value stored in the latch of each row determines whether the power gate control of that row causes the power gating circuitry 30, 32, 34, 36 respectively of the rows to power gate the corresponding row or to maintain power to that row (by maintaining the connection between VSSCOREn and the common VSS rail VSSC) when the memory device enters a retention mode. The common VSSC power rail is connected to VSS via the footer power gate circuitry 38, which is provided as a low-leakage device, in particular having a lower leakage characteristic (either by virtue of the thickness of its gate oxide or its length) with respect to the power gate circuitry 30-36 of the individual rows. This enables the size of the row driver circuitries 14-20 to be kept relatively small, whilst still allowing the row-based retention control of the present techniques to result in a useful reduction in power-down mode leakage current. The footer power gate 38 is controlled by the signal npower_down, which is asserted when the device goes into its powered-down mode.

Figure 2:
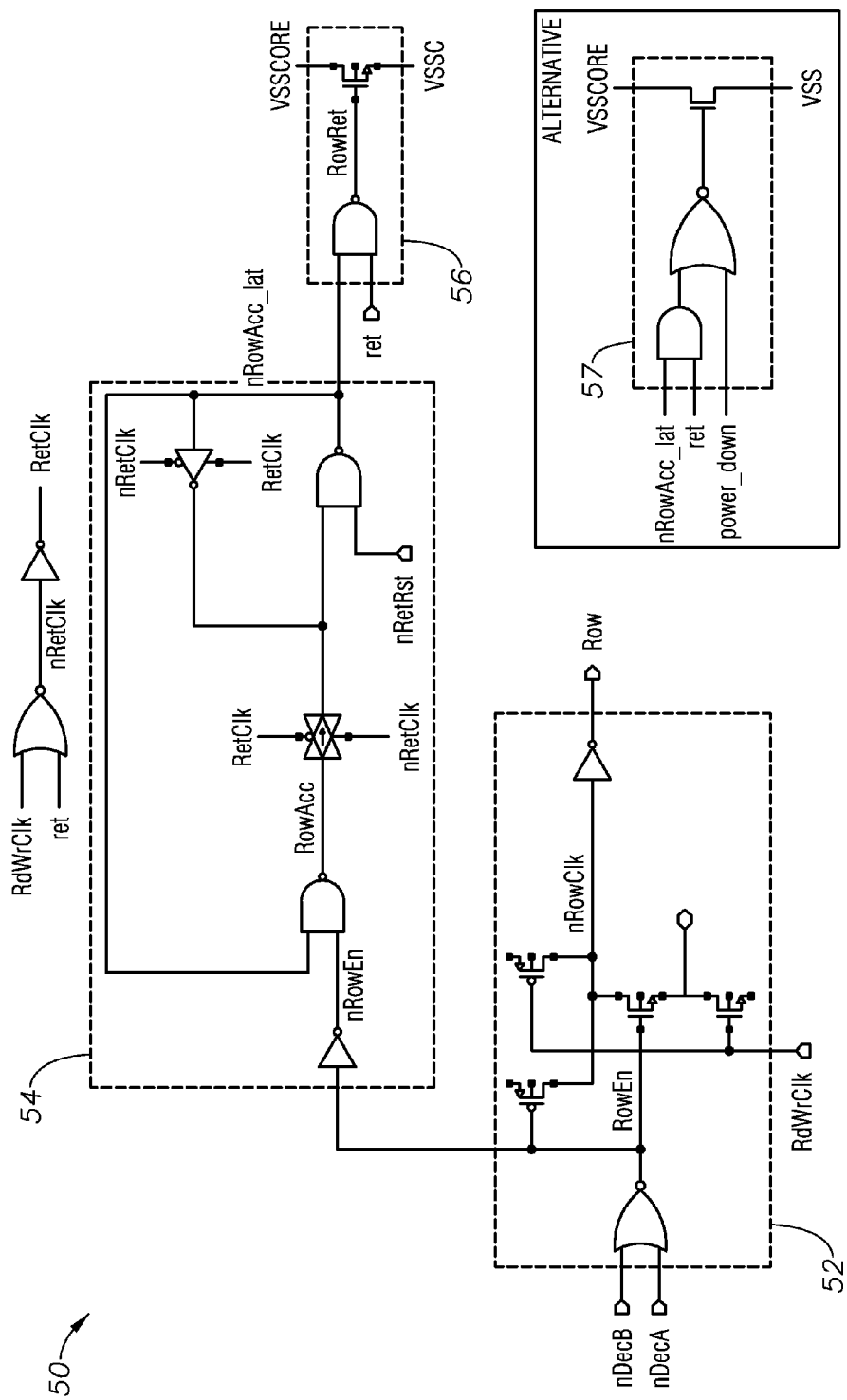
FIG. 2 schematically illustrates row driver circuitry in one embodiment.

FIG. 2 is a circuit schematic showing the detailed configuration of the latch and power gate control in the row driver circuitry 50 in one embodiment. This embodiment has a configuration which enables the power gate control to "remember" whether this row has been accessed, and if the row has ever been accessed (since reset) then the content of the row will be retained when the memory device goes into retention mode. Otherwise, the power gate circuitry causes the row to be power gated and the content of the row is lost when going into the retention mode. Beginning consideration of the circuitry shown at the far left of FIG. 2, at the input to the row selection circuitry 52, the signals nDecA and nDecB are the relevant row address signals for this row of the memory device and the NOR gate generates the decoded 1-hot row address signal RowEn. As can be seen from the circuitry in the lower part of FIG. 2 the value RowEn generates the row selection signal Row in dependence on the read/write clock signal RdWrClk. However, the value of RowEn is also passed into the latch circuitry 54 shown in the upper part of FIG. 2. The signal RowEn is passed from the row selection circuitry 52 to the latch circuitry 54, where (inverted as nRowEn) it determines the value generated for the signal RowAcc generated by the NAND gate, in combination with the value of nRowAcc_lat which is held by the latch. Accordingly, whilst RowEn remains 0, nRowAcc_lat remains latched as 1. This value of nRowAcc_lat forms one input to the power gating circuitry 56, with the other input of the NAND gate being provided by the retention signal ret. Thus, if the memory device goes into retention, in other words if the ret signal is asserted as 1, the latched value of nRowAcc_lat=1 causes the row retention value RowRet to be 0, and accordingly VSSCORE for this row is not coupled to the common VSSC rail and the row is power gated and its content will not be retained. FIG. 2 also shows an alternative configuration to the power gating circuitry 56, namely the power gating circuitry 57, which takes the additional input power_down (i.e. the inverse of npower_down) and is used in a device which does not have a separate power-gating footer such as gate 38 in FIG. 1. The row power gates then directly connect VSSCORE to VSS. All bitcells are power-gated when power_down=1, overriding their respective latch value and the retention signal. This may be useful for devices operating at a higher voltage (above sub-threshold or near-threshold), when the power gates are not very large (e.g. thick gate oxide) devices. This modification to the control of the connection between VSSCORE and VSS (i.e. not going via VSSC) can also be made in any of the other embodiments discussed herein, each having the final NAND2 gate changed to an AOI as shown in example of the circuitry 57 in FIG. 2.

However, when this row is selected for access and a value of RowEn=1 is generated in the row access circuitry 52, this value of RowEn is latched into the latching circuitry 54, causing the latch to hold a value of nRowAcc_lat=0, and moreover the feedback path causes the latch input to be gated off, so that this latched value will continue to be held undisturbed regardless of the further access to this row and changes in the value of RowEn. Now that a value of nRowAcc_lat=0 is held in the latch, if the memory device goes into retention (ret=1) this then causes the row retention signal RowRet to be generated as 1 and consequently VSSCORE for this row is coupled to the common VSSC rail and the content of this row will be retained. The latch (and indeed the latch of all other rows) can be reset by a negative pulse on nRetRst (which is otherwise held as 1). This is provided from a source external to the memory device, for example when it is determined that all data within the memory device is now invalid, for example having already been transferred off chip.

Figure 3:
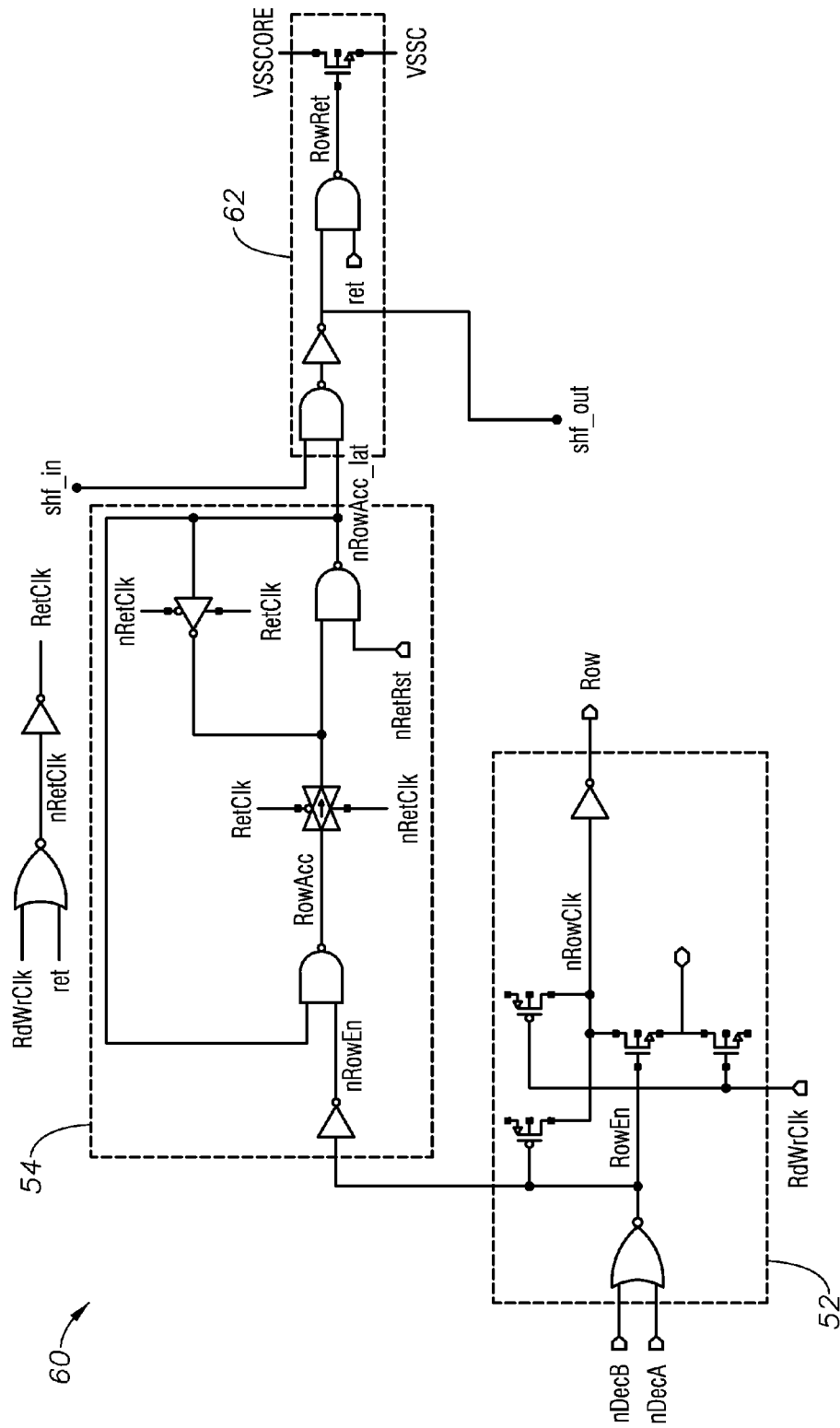
FIG. 3 schematically illustrates row driving circuitry having connections to adjacent row driver circuitry in one embodiment.

FIG. 3 shows the row driver circuitry 60 in another embodiment, in which the row selection circuitry 52 and the latch circuitry 54 are identical to those components of the row driver circuitry 50 in FIG. 2, and are not described again here. The difference between the row driver circuitry 60 of FIG. 3 and the row driver circuitry 50 of FIG. 2 can be seen in the power gating circuitry 62, where the power gating circuitry of 62 further comprises override circuitry with respect to the power gating circuitry 56 of the row driver circuitry 50 shown in FIG. 2. This override circuitry, formed by the NAND and NOT gate makes the control over the power gating of this row further dependent on the value of the override (shift) input signal shf_in. The shf_out output of a row of the memory device forms the input shf_in to the next lower row of the memory device. The highest row of the memory device has shf_in tied to 1, whilst the lowest row does not make use of its shf_out output. The configuration of the override circuitry (NAND and NOT gates) in the power gating circuitry 62 means that whilst a value of shf_in=1 is received by the override circuitry, the power gating will depend on the value held in the latch in the same manner as was described above with reference to FIG. 2, i.e. when nRowAcc_lat=1 then RowRet=0 and the content of the row is not retained, whilst when nRowAcc_lat=0, RowRet=1 and the content of this row will be retained. However, a further consequence of a row of the memory device having row driver circuitry such as that shown in FIG. 3 is that when a value of nRowAcc_lat=0 is latched, this causes the value of shf_out generated by the override circuitry of the power gating circuitry 62 of this row to become 0. As a result the next lower row in the memory device receives a value of shf_in=0, which causes the override circuitry to override the value of nRowAcc_lat held in the latch of that row and RowRet will be generated as one, regardless of whether this row has actually been accessed or whether the value held in the latch is actually 0. Furthermore, the value of shf_out for this next lower row is also generated as 0 and this cascade continues down the rows of the memory device to the lowest row therein. In other words, the override circuitry can also be viewed as a variety of shift circuitry which converts the latched value of nRowAcc_lat=0 in the highest accessed row into a thermometric code starting from the top most accessed row, causing RowRet to be generated as 1 for this row and all lower rows. Accordingly, the highest accessed row and all lower rows will be retained when the memory device goes into retention (ret=1).

Figure 4:
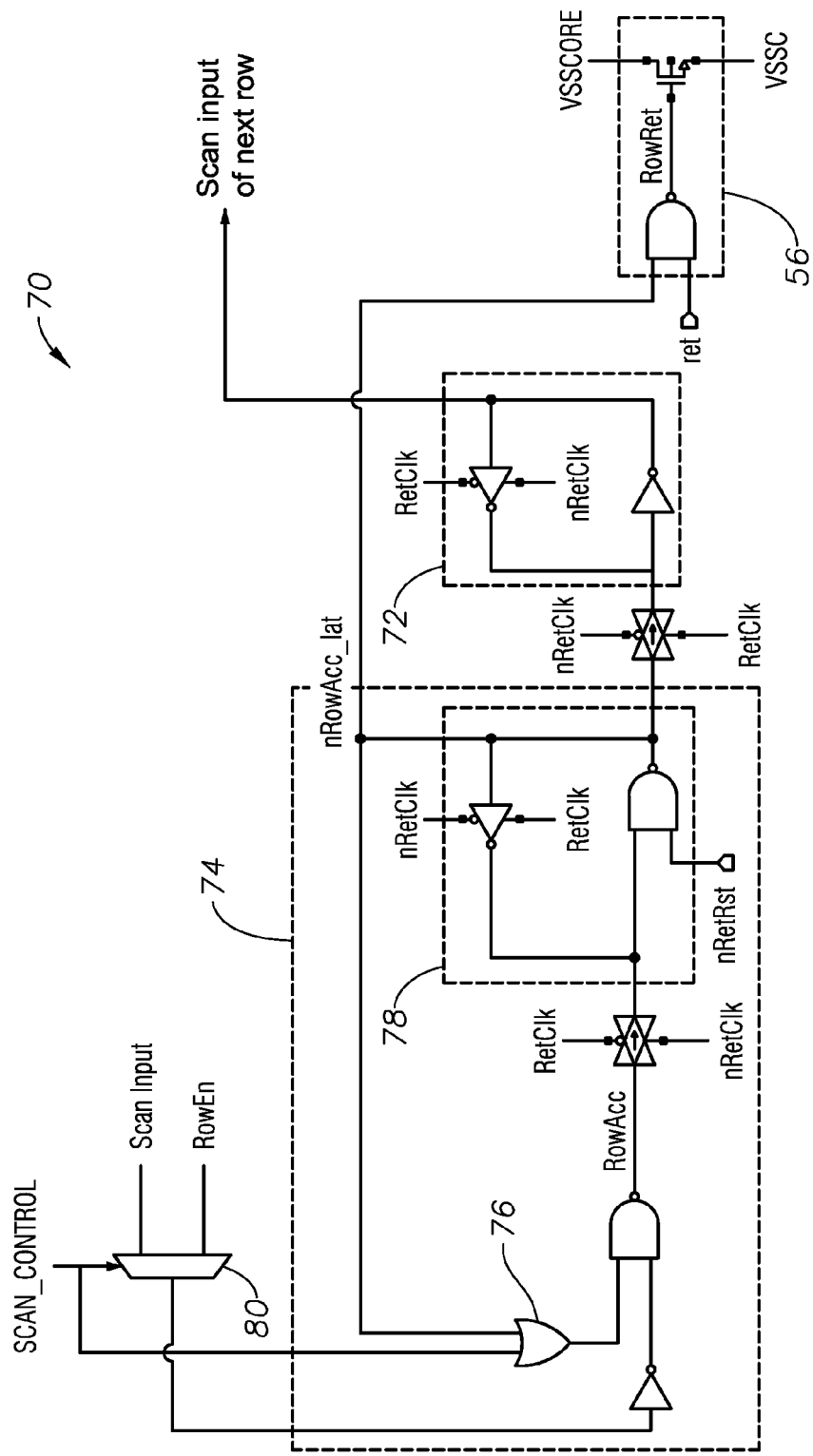
FIG. 4 schematically illustrates row driver circuitry with scanning capability in one embodiment.

FIG. 4 shows another variant on the circuitry shown in FIG. 2, wherein the row driver circuitry 70 shown in FIG. 4 comprises the same power gating circuitry 56 as described with reference to FIG. 2. The latch circuitry 74 is very similar to the latch circuitry 54 of FIG. 2, with the addition of NOR gate 76. In addition, the row driver circuitry 70 comprises a slave latch 72 and a scan control multiplexer 80. The slave latch 72 thus forms a flip-flop with the master latch 78 of the latching circuitry 74. The multiplexer 80, under the control of the scan control signal SCAN_CONTROL, enables either the usual row selection signal RowEn to be passed into the latching circuitry 74, or by selecting the other input to the multiplexer 80 allows a scan input to be passed into the latching circuitry 74 and thus latched into the master latch 78 and then into the slave latch 72. The scan control signal SCAN_CONTROL also forms one input to NOR gate 76, the other being the feedback from the master latch 78 (i.e. nRowAcc_lat) so that the gating of the input to the master latch is overridden in scan mode. The value held by the slave latch 72 also forms the scan input of the next row and one or more (possibly all) of the rows of the memory device can be concatenated together in this manner in order to form a scan chain. Thus, this serial connection of the slave latches of each row driver enable a shift register to be formed and a specific pattern of values can be scanned into the slave latches, enabling a corresponding pattern of power gating of the rows to be implemented. Similarly, the retention latch pattern can be scanned out after a certain period of operation. Both of these varieties of scan functionality are useful for test and debug purposes. The SCAN_CONTROL signal thus performs the role of either a scan-in control signal or a scan-out control signal, depending on the context of scan operation.

Figure 5A:
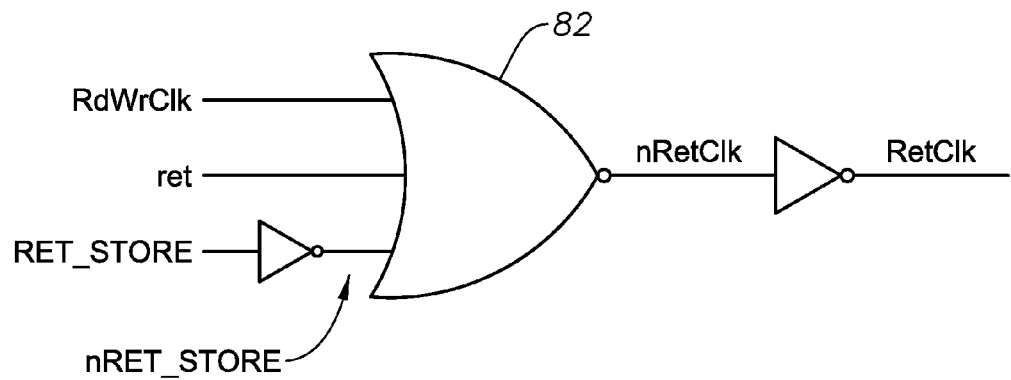
FIG. 5A schematically illustrates a portion of the row driver circuitry in one embodiment in which a row enable signal can be latched into the retention latch in a dedicated clock cycle in dependence on a control signal.
Figure 5B:
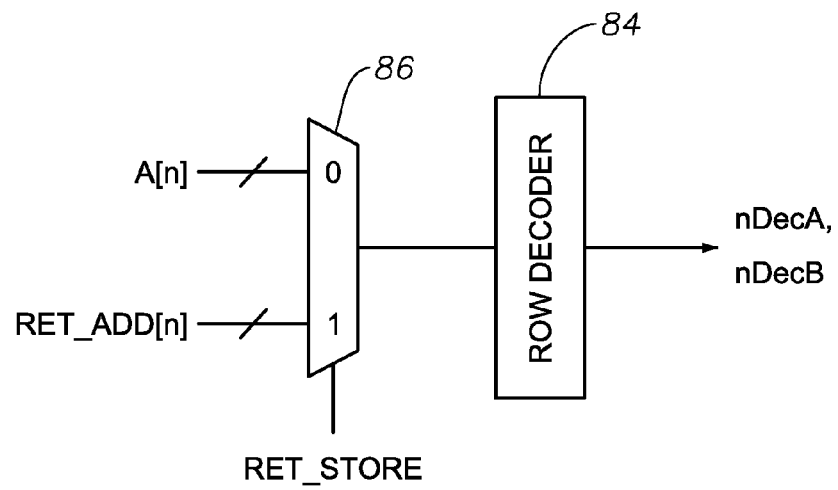
FIG. 5B schematically illustrates a portion of the row driver circuitry in one embodiment in which a retention address is provided to the memory device and a corresponding bit of this retention address may be latched into the retention latch in a dedicated clock cycle.

FIGS. 5A and 5B illustrate some variants on embodiments of the row driver circuitry. FIG. 5A shows an embodiment which modifies the RetClk generation circuitry shown at the top of FIGS. 2 and 3. The control signal RET_STORE, which may for example be provided by an enable pin on the periphery of the memory device, provides a further input into the NOR gate 82 (inverted as nRET_STORE), so that RetClk is also asserted when RET_STORE is asserted, allowing a particular value to be clocked into the latch (see description of FIG. 5B below).

FIG. 5B shows how the same control signal RET_STORE of FIG. 5A is used to control the coupling of a "retention address" bus RET_ADD[n], rather than the usual address bus A[n], to the input of the row decoder of this row driver, such that a selected value can be latched into the retention latch via the multiplexer 86 under the control of the control signal RET_STORE. Using the configuration such as that illustrated in FIG. 5B, a selected retention latch pattern can be directly implemented in the retention latches of the row driver circuitry of the memory device by asserting an appropriate "address" on the retention address bus RET_ADD and then using the control signal RET_STORE in order to pass this into the respective latches, possibly during a dedicated clock cycle. In other words, the memory device may be configured to operate in the usual manner with regard to read and write accesses to the memory device with regard to some clock cycles, but a selected clock cycle (when RET_STORE is asserted) may be defined during which no read or write access to the memory device is made, but such dedicated control of the retention latches can be carried out.

Figure 6A:
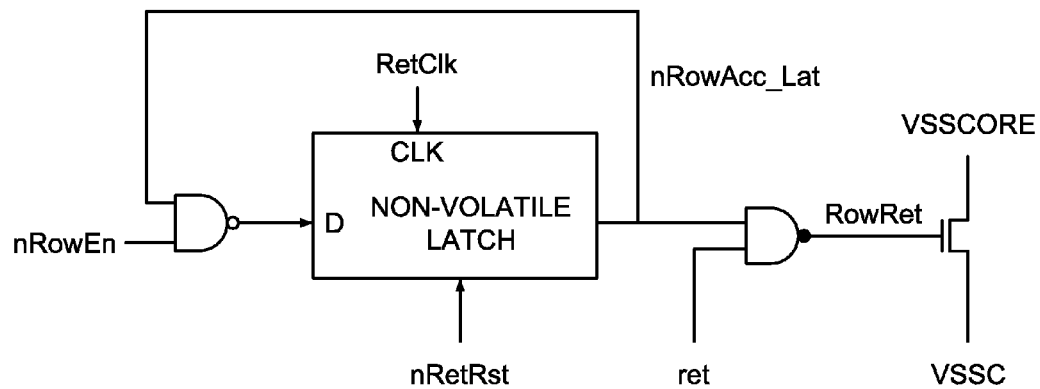
FIG. 6A schematically illustrates a non-volatile retention latch in one embodiment.

FIG. 6A shows an embodiment of the latching circuitry in which the retention latch is provided as a non-volatile latch. Accordingly, whilst this latching circuitry shown in FIG. 6A may form part of any of the above-described embodiments of the row driver circuitry, operating as described, the use of a non-volatile latch such as that shown in FIG. 6A means that after the memory device has entered its retention mode (and powered down) and then subsequently exited this sleep mode the values stored in the retention latches in the row driver circuitry of the memory device are maintained, meaning that these may either then continue to be used and updated, or for example may be accessed and scanned out (in the context of an embodiment such as that shown in FIG. 4). The particular form that the non-volatile latch takes may vary, but contemporary non-volatile storage can support an embodiment in which such a non-volatile latch may be provided without this occupying significantly more area in the row driver circuitry with more traditional volatile latches.

Figure 6B:
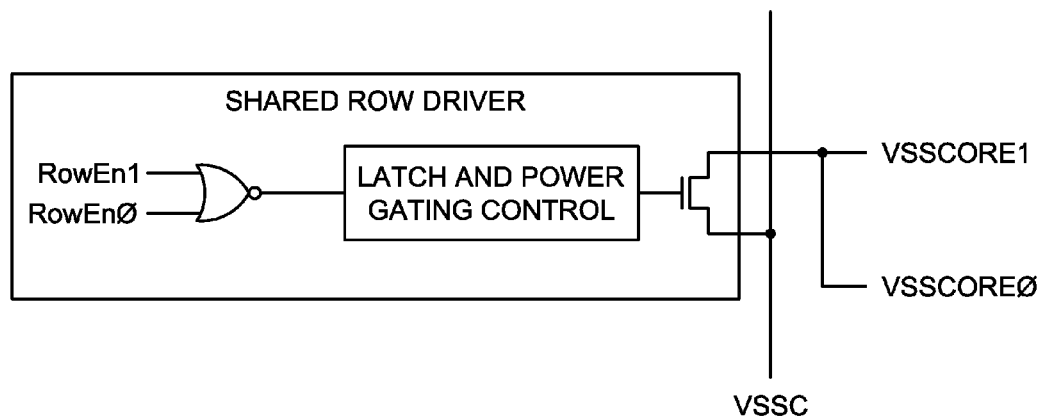
FIG. 6B schematically illustrates shared row driver circuitry in one embodiment.

FIG. 6B illustrates an embodiment showing shared row driver circuitry and its latch and power gating control, in which one power gate is shared by two rows. Thus if either row is accessed the shared latch will be set and both rows will be retained in retention mode. Since power gate sizing is typically based on all bitcells in a row switching at once during a write, the power gate may need to be sized in order to correspondingly cope with the maximum current that may thus flow. Depending on the system requirements it may be determined that the size of the corresponding power gate may be then preferably shared between more than one row, in order to keep the associated size of the row driver circuitries in check. In such an embodiment, a trade off is then to be made between the leakage saving which can be achieved, and the area taken up by the provision of the power gating circuitry.

Figure 6C:
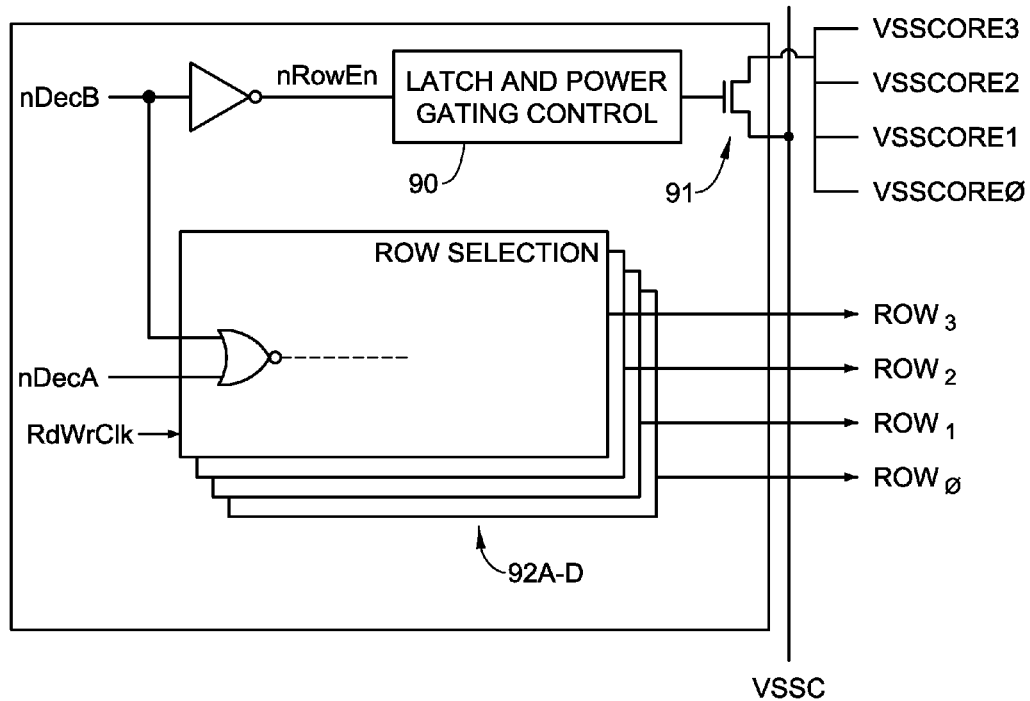
FIG. 6C schematically illustrates four row drivers in one embodiment which share latching circuitry and power gating circuitry.

FIG. 6C illustrates another embodiment in which four row drivers share one set of latch and power gating control circuitry 90, and in which one power gate 91 is shared by four rows. Each row has its own row selection circuitry 92A-D, as in the manner of the row selection circuitry 52 in FIG. 2 (with the absence of the RowEn input to the latch circuitry). Here the partially decoded address lines nDecA and nDecB, which here are based on an (example) 5-bit row address bus A[4:0], are a 2-to-4 decoded version of A[1:0] (nDecA) and a 3-to-8 decoded version of A[4:2] (nDecB). So nDecB addresses blocks of 4 rows, and nDecA addresses single rows within each block of 4. Note that since the retention granularity is a block of 4 rows, the further addressing of nDecA is not needed and just nDecB can be used. Note therefore that larger blocks don't necessarily mean more NOR gates to combine more decoded signals.

Figure 7:
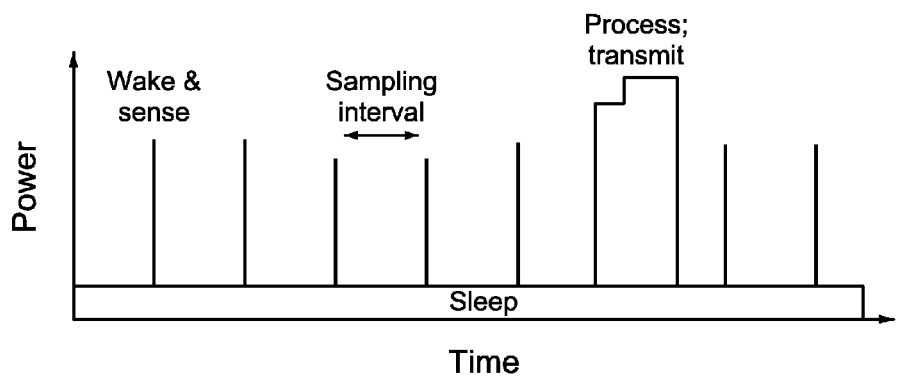
FIG. 7 shows the power consumption of a data processing device comprising a memory device in one embodiment.
Figure 8:
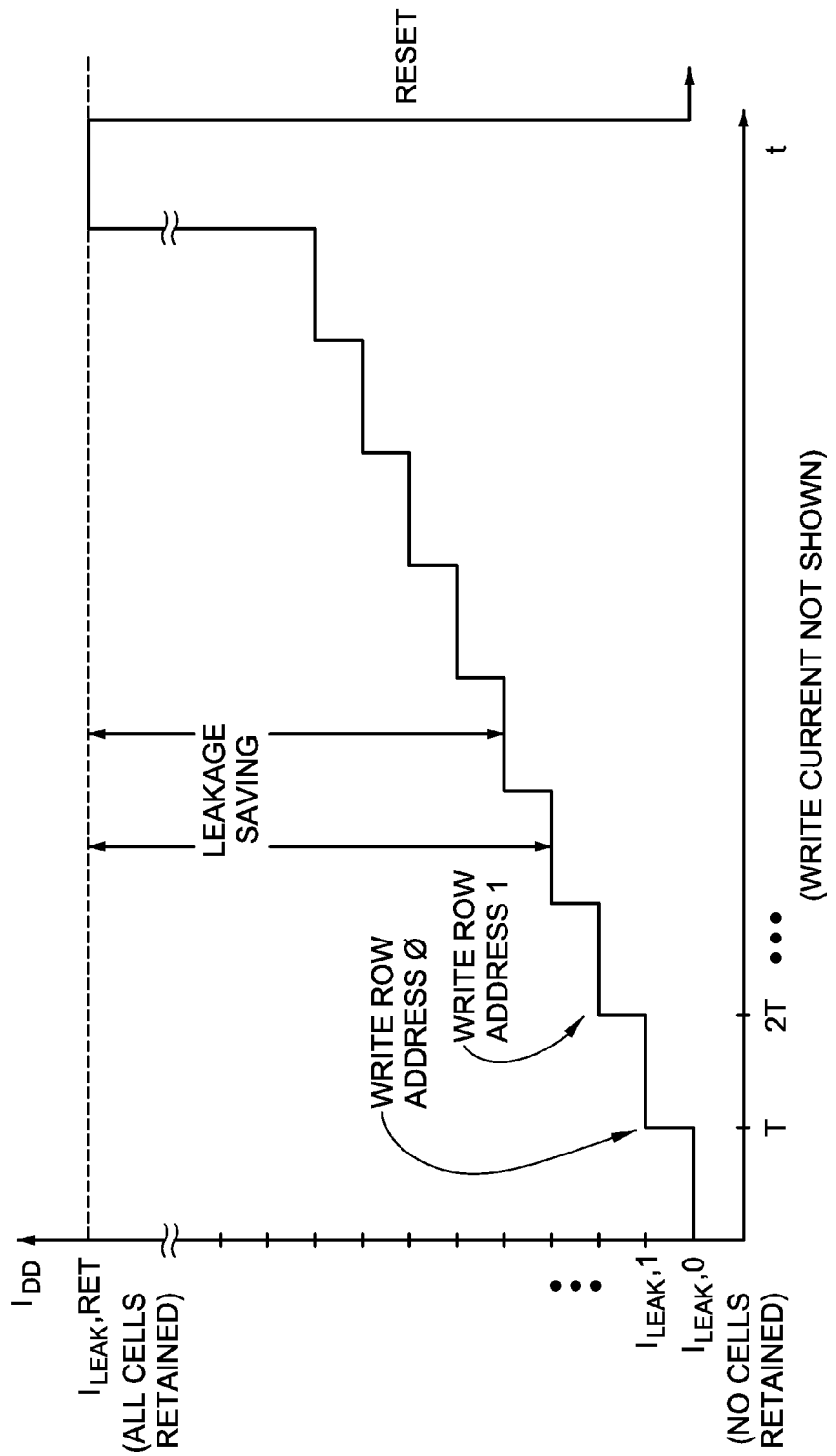
FIG. 8 shows the evolution of leakage current with time in a memory device in which memory addresses are sequentially written.

FIG. 7 shows an example of the power consumption with time of a data processing device comprising a memory device according to the present techniques. In particular, it should be noted that the data processing device spends the majority of its time in a sleep mode, only waking up periodically in order to perform data processing operations. In the example of FIG. 7 the data processing apparatus is a wireless sensor node, which wakes up periodically to sample its sensor and store a corresponding small amount of data into its memory device (for example occupying a single row of the memory device), and then after a series of samples have been taken from the sensor over a period of time the device processes a set of data into a suitable data packet which is then transmitted (wirelessly) to a remote recipient. Due to the fact that this device spends the majority of its time in a deep sleep retention mode, the power consumption in its sleep mode (which is dominated by the SRAM leakage) is a significant factor in determining the overall power consumption of the device, which can thus benefit well from the application of the present techniques. This is illustrated further by FIG. 8, showing the evolution of the leakage current of an SRAM device in which row addresses are sequentially written. The present techniques thus enable the memory device to enter its retention mode and power gate memory locations which are not currently used, rather than for example maintaining an entire block of memory in its retention mode when only a fraction of that block contains valid data. The area above the line in FIG. 8 shows the leakage saving which may be achieved by the present techniques.

Figure 9:
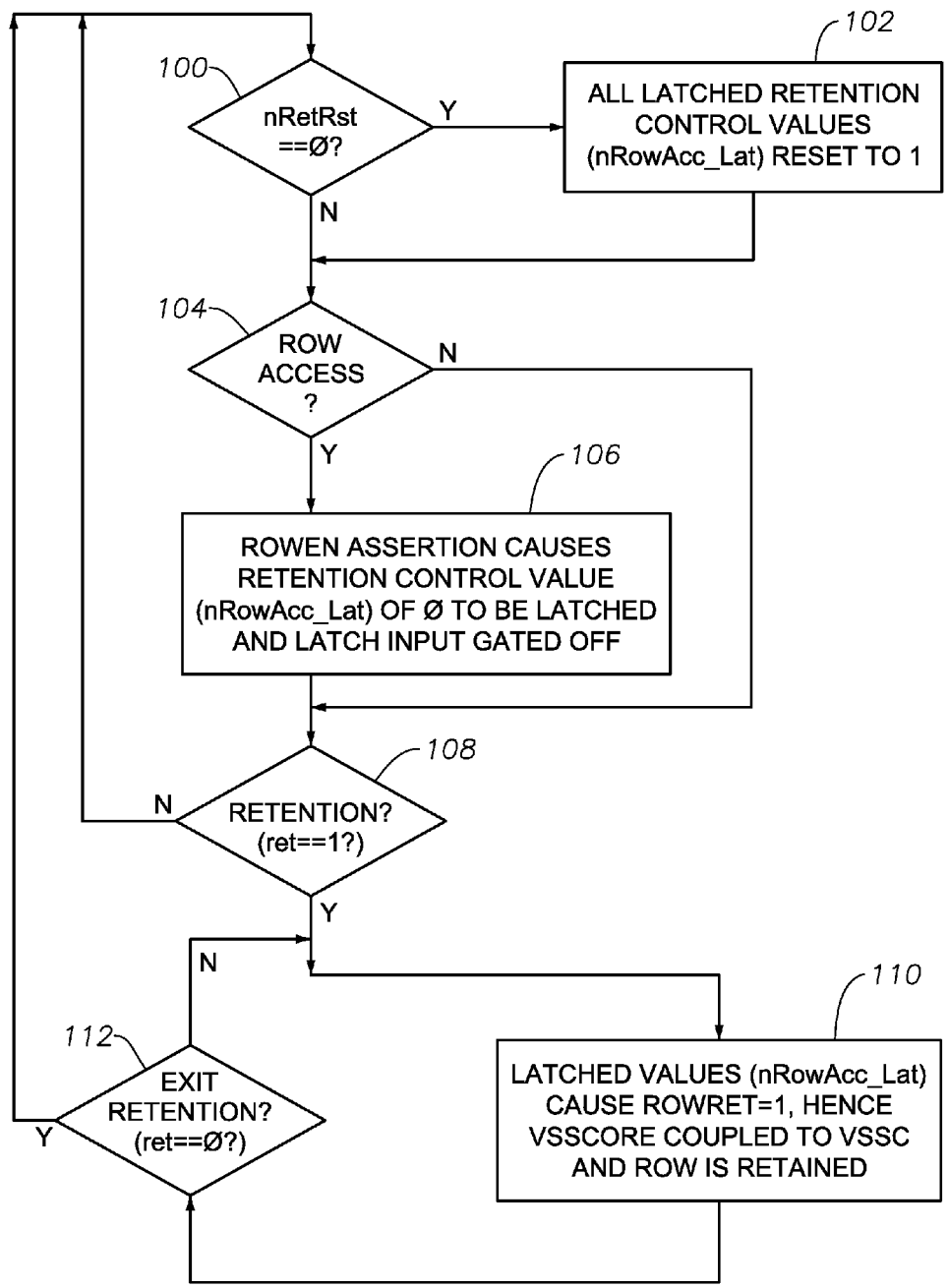
FIG. 9 shows a sequence of steps which are taken according to the method of one embodiment.

FIG. 9 shows a sequence of steps which are taken in the method of one embodiment, when operating a memory device according to the present techniques. The flow can be considered to begin at step 100 where it is determined if the retention reset signal nRetRst is 0. When this is the case the flow proceeds via step 102 where all latched retention control values (nRowAcc_lat) are reset to 1. Then at step 104 it is determined if a row access to a row of the memory device is taking place. If it is, then the flow proceeds via step 106 where the consequent assertion of the row selection signal RowEn causes the latched control value (nRowAcc_lat) to switch to 0 and the input to the retention latch is gated off. Then at step 108 it is determined if the memory device is entering its retention mode (by the assertion of the signal ret=1). If the retention mode should not be entered then the memory device continues its normal operation and the flow returns to step 100. However, when the retention mode is entered the flow proceeds to step 110 where the values held in the retention latches cause RowRet values of 1 to be asserted in the corresponding rows and to control the power gating circuitry of the corresponding rows such that VSSCORE is coupled to VSSC and the values stored in the corresponding row are retained, whilst the memory device is in its retention (sleep) mode. For any rows where there is still a latched value of 1, i.e. this row has yet to be accessed, the VSSCORE is not coupled to VSSC and the content of the row is lost in retention (but the leakage current associated with this row is greatly reduced). Then it is determined that step 112 if the memory device is exiting its retention mode (by ret switching to 0). Whilst this is not the case the flow continues around the loop of steps 110 and 112 and the retention mode continues with the data values in the retained rows being maintained. However, once the memory device should exit its retention mode by the assertion of ret=0 the flow returns to step 100.

In brief overall summary a memory device and method of operating the memory device are provided. The memory device has bitcells arranged in a plurality of rows and columns. Row driver circuitry provides access to the array of bitcells by selection of an access row of the plurality of rows. The row driver circuitry comprises a retention control latch to store a retention control value and row power gating circuitry responsive to a retention signal to power gate at least one row when the retention control value has a first value and to leave the at least one row powered when the retention control value has a second value. Row-based retention of the content of the bit cells is thus provided, and the leakage current of the memory device when it is in a retention (e.g. sleep) mode, and only some of its rows contain valid data, can thus be reduced.

In the present application, the words "configured to . . . " or "arranged to" are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" or "arranged to" does not imply that the apparatus element needs to be changed in any way in order to provide the defined operation.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope and spirit of the invention as defined by the appended claims. For example, various combinations of the features of the dependent claims could be made with the features of the independent claims without departing from the scope of the present invention.

We claim:

1. A memory device comprising:
an array of bitcells arranged in a plurality of rows and a plurality of columns; and
row driver circuitry to provide access to the array of bitcells by selection of an access row of the plurality of rows,
wherein the row driver circuitry comprises a retention control latch to store a retention control value and row power gating circuitry responsive to a retention signal to power gate at least one row when the retention control value has a first value and to leave the at least one row powered when the retention control value has a second value.

2. The memory device as claimed in claim 1, wherein the row driver circuitry comprises row access capturing circuitry to set the retention control value to the second value when at least one of the at least one rows is accessed.

3. The memory device as claimed in claim 2, wherein the row driver circuitry comprises address decoding circuitry responsive to a memory address which specifies the access row to generate a row enable signal, and the row access capturing circuitry is responsive to generation of the row enable signal to set the retention control value to the second value.

4. The memory device as claimed in claim 1, wherein the row driver circuitry comprises row selection input circuitry to receive a row selection signal and the row driver circuitry is responsive to assertion of the row selection signal to set the retention control value to the second value.

5. The memory device as claimed in claim 4, further comprising a retention address bus to carry a retention address and wherein the row driver circuitry comprises retention address decoding circuitry to generate the row selection signal in dependence on the retention address.

6. The memory device as claimed in claim 1, wherein the row driver circuitry comprises latch update control circuitry responsive to a received update control signal to allow the retention control value to be changed when the update control signal has a first value and to prevent the retention control value from being changed when the update control signal has a second value.

7. The memory device as claimed in claim 1, wherein the row driver circuitry comprises retention value override circuitry to modify the retention control value to be received by the row power gating circuitry in dependence on an override signal,
wherein the retention value override circuitry of a first row of the array is coupled to the retention value override circuitry of a second row of the array, wherein an output of the retention value override circuitry of the first row provides the override signal for the retention value override circuitry of the second row.

8. The memory device as claimed in claim 7, wherein the retention value override circuitries of the plurality of rows are concatenated into a serial sequence.

9. The memory device as claimed in claim 1, wherein the row driver circuitry comprises a slave latch coupled to the retention control latch, and the slave latch of a first row is coupled to the retention control latch of a second row of the array to form a synchronous scan path.

10. The memory device as claimed in claim 9, wherein the slave latches and retention control latches of the plurality of rows are concatenated into the synchronous scan path.

11. The memory device as claimed in claim 9, wherein the memory device is responsive to a scan-out control signal to scan out a set of retention control values held in the slave latches of the row driver circuitry of the plurality of rows.

12. The memory device as claimed in claim 9, wherein the memory device is responsive to a scan-in control signal to scan in a set of retention control values into the slave latches of the row driver circuitry of the plurality of rows.

13. The memory device as claimed in claim 1, wherein the array of bitcells comprises a plurality of banks of bitcells, the row driver circuitry comprises access clock input circuitry to receive an access clock signal, and the row driver circuitry is dependent on assertion of the access clock signal and a bank selection signal to allow selection of that row of the plurality of rows.

14. The memory device as claimed in claim 1, wherein the retention control latch comprises non-volatile storage to store the retention control value.

15. The memory device as claimed in claim 1, wherein the at least one row comprises power gating circuitry to power gate the at least one row in dependence the retention control value stored in the retention control latch.

16. The memory device as claimed in claim 1, wherein at least one shared power gate row comprises power gating circuitry to power gate the at least one shared power gate row and at least one further shared power gate row in dependence on the retention control value stored in the retention control latch or latches of the at least one shared power gate row.

17. The memory device as claimed in claim 1, comprising footer power gate circuitry to power gate the plurality of rows in dependence on the retention signal, wherein the footer power gate circuitry exhibits a lower current leakage than power gate circuitry of any of the plurality of rows.

18. A method of operating a memory device comprising:
storing data in an array of bitcells arranged in a plurality of rows and a plurality of columns;

providing access to an access row of the array of bitcells by selection of the access row of the plurality of rows;

storing a retention control value for a row of the plurality of rows; and in response to a retention signal, power gating at least one row when the retention control value has a first value and leaving the at least one row powered when the retention control value has a second value.

19. A memory device comprising:

means for storing data in an array of bitcells arranged in a plurality of rows and a plurality of columns;

means for providing access to an access row of the array of bitcells by selection of the access row of the plurality of rows;

means for storing a retention control value for a row of the plurality of rows; and means for power gating at least one row in response to a retention signal when the retention control value has a first value, means for leaving the at least one row powered in response to the retention signal, when the retention control value has a second value.

\* \* \* \* \*